United States Patent [19]

(12) United States Patent
Izumi

(10) Patent No.: US 7,777,262 B2
(45) Date of Patent: Aug. 17, 2010

(54) SEMICONDUCTOR DEVICE HAVING INTERLAYER INSULATING FILM COVERED WITH HYDROGEN DIFFUSION BARRIER FILM AND ITS MANUFACTURE METHOD

(75) Inventor: Kazutoshi Izumi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 510 days.

(21) Appl. No.: 11/229,075

(22) Filed: Sep. 19, 2005

(65) Prior Publication Data

US 2006/0278954 A1  Dec. 14, 2006

(30) Foreign Application Priority Data

Jun. 9, 2005  (JP)  ............................. 2005-169371

(51) Int. Cl.
*H01L 27/108* (2006.01)
(52) U.S. Cl. ................................ 257/296; 257/E27.104
(58) Field of Classification Search .......... 257/E21.241, 257/295, 296, 298, 301, E27.104; 438/3
See application file for complete search history.

(56) References Cited

U.S. PATENT DOCUMENTS

| 6,218,197 | B1  |     | 4/2001  | Kasai |  |
|---|---|---|---|---|---|
| 6,294,438 | B1 | *  | 9/2001  | Arita et al. | ................... 438/396 |
| 6,455,882 | B1 | *  | 9/2002  | Nakura | ....................... 257/295 |
| 6,750,492 | B2 |     | 6/2004  | Mikawa et al. |  |
| 6,872,617 | B2 |     | 3/2005  | Sashida |  |
| 7,553,677 | B2 | *  | 6/2009  | Kitahara et al. | ................. 438/3 |
| 2001/0020708 | A1 | *  | 9/2001  | Kasai | .......................... 257/295 |
| 2003/0235969 | A1 | *  | 12/2003 | Yokota | ........................ 438/396 |
| 2004/0043517 | A1 | *  | 3/2004  | Sashida | ........................... 438/3 |
| 2004/0089894 | A1 | *  | 5/2004  | Sashida | ........................ 257/306 |
| 2004/0104417 | A1 | *  | 6/2004  | Song et al. | .................. 257/296 |
| 2004/0166596 | A1 | *  | 8/2004  | Sashida et al. | ................. 438/3 |

(Continued)

FOREIGN PATENT DOCUMENTS

JP     3362712      10/2002

(Continued)

OTHER PUBLICATIONS (McGraw-Hill Dictionary of Scientific and Technical Terms, pp. 566, Sixth Edition, 2003 Library of Congress-in-Publication Data).*

(Continued)

*Primary Examiner*—W. David Coleman
*Assistant Examiner*—Latanya Crawford
(74) *Attorney, Agent, or Firm*—Westerman, Hattori, Daniels & Adrian, LLP

(57) ABSTRACT

An interlayer insulating film made of insulating material is formed on a semiconductor substrate. A hydrogen diffusion barrier film is formed on the interlayer insulating film, the hydrogen diffusion barrier film being made of material having a higher hydrogen diffusion barrier function than a hydrogen diffusion barrier function of material of the interlayer insulating film. The semiconductor substrate formed with the interlayer insulating film and hydrogen diffusion barrier film is thermally treated. In the process of forming the interlayer insulating film, the interlayer insulating film is formed under the condition that a moisture content becomes $5 \times 10^{-3}$ g/cm$^3$ or lower. Even if annealing is performed after the hydrogen diffusion barrier film is formed, a crack is hard to be formed in the underlying interlayer insulating film.

7 Claims, 7 Drawing Sheets

U.S. PATENT DOCUMENTS

| | | | |
|---|---|---|---|
| 2005/0012133 A1 | 1/2005 | Mikawa et al. | |
| 2005/0072998 A1* | 4/2005 | Miura et al. | 257/295 |
| 2005/0148139 A1* | 7/2005 | Sashida | 438/239 |
| 2005/0161716 A1* | 7/2005 | Matsuura et al. | 257/295 |
| 2005/0212020 A1* | 9/2005 | Izumi et al. | 257/295 |
| 2005/0230779 A1* | 10/2005 | Ito | 257/499 |

FOREIGN PATENT DOCUMENTS

| | | |
|---|---|---|
| JP | 2004-087978 A | 3/2004 |
| JP | 2004-303995 | 10/2004 |
| JP | 07-273194 A | 2/2010 |
| WO | WO 02/056382 | 7/2002 |
| WO | WO 2004/095578 | 11/2004 |

OTHER PUBLICATIONS

Chinese Office Action dated May 23, 2008; corresponding with Chinese Application No. 200510107113.2.

Chinese Office Action mailed Dec. 18, 2009, issued in corresponding Chinese Application No. 2008101490074.

Japanese Office Action mailed Feb. 2, 2010 in Corresponding Japanese Application No. 2005-169371.

* cited by examiner

FIG.3

| Sample No. | Growth Temperature (°C) | Input Power (W) | Pressure (Pa) | O₂ Flow Rate (sccm) | TEOS Flow Rate (mg/min) | Thickness Uniformity (%) | Growth Rate (nm/min) |
|---|---|---|---|---|---|---|---|
| 1 | 390 | 700 | 1197 | 2980 | 690 | 4.27 | 30.7 |
| 2 | | | 931 | | | 4.28 | 40.3 |
| 3 | | | 665 | | | 3.78 | 51.8 |

SEMICONDUCTOR DEVICE HAVING INTERLAYER INSULATING FILM COVERED WITH HYDROGEN DIFFUSION BARRIER FILM AND ITS MANUFACTURE METHOD

CROSS REFERENCE TO RELATED APPLICATION

This application is based on and claims priority of Japanese Patent Application No. 2005-169371 filed on Jun. 9, 2005, the entire contents of which are incorporated herein by reference.

BACKGROUND OF THE INVENTION

A) Field of the Invention

The present invention relates to a semiconductor device and its manufacture method, and more particularly to a semiconductor device having an interlayer insulating film covered with a hydrogen diffusion barrier film and its manufacture method, and to a manufacture method for a semiconductor device having a silicon oxide film with a low moisture content.

B) Description of the Related Art

FIG. 6A is a cross sectional view of a ferroelectric memory disclosed in Publication WO/2004/095578. An element isolation insulating film 101 is formed in a surface layer of a silicon substrate 100. A MOS transistor 102 is formed in an active region defined by the element isolation insulating film 101. An interlayer insulating film 103 is formed on the silicon substrate 100, covering the MOS transistor 102.

A ferroelectric capacitor 105 is formed on the interlayer insulating film 103. The ferroelectric capacitor 105 has a lamination structure of a lower electrode 105A, a capacitor ferroelectric film 105B and an upper electrode 105C stacked in this order. A second layer interlayer insulating film 106 of silicon oxide is formed on the interlayer insulating film 103, covering the ferroelectric capacitor 105.

The interlayer insulating film 106 is formed by atmospheric pressure chemical vapor deposition (atmospheric pressure CVD) or plasma enhanced CVD using tetraethylorthosilicate (TEOS) and ozone ($O_3$). A hydrogen diffusion barrier film 107 of alumina is formed on the interlayer insulating film 106. The hydrogen diffusion barrier film 107 prevents hydrogen from penetrating the ferroelectric capacitor 105.

SUMMARY OF THE INVENTION

Annealing is performed to recover deterioration of the characteristics of the ferroelectric capacitor 105, after the alumina film 107 for preventing hydrogen diffusion is formed and before a multi-layer wiring structure is formed. Interlayer cracks are formed in some cases during annealing.

FIG. 6B is a diagram sketched from an electron microscopic photograph of a sample having a crack. The interlayer insulating film 106 covers the ferroelectric capacitor 105. It can be seen that a crack 110 is formed in and under the interlayer insulating film 106. If the hydrogen diffusion barrier film 107 is not formed, moisture contained in the interlayer insulating film 106 is desorbed during annealing. Formation of the crack 110 may be ascribed to a volume expansion of moisture included in the interlayer insulating film 106 because moisture diffusion is suppressed by the hydrogen diffusion barrier film 107.

An object of this invention is to provide a semiconductor device capable of suppressing generation of a crack in an interlayer insulating film under a hydrogen diffusion barrier film even if annealing is performed after the hydrogen diffusion barrier film is formed, and a manufacture method for such a semiconductor device.

According to one aspect of the present invention, there is provided a semiconductor device comprising: a semiconductor substrate having semiconductor elements formed thereon; an interlayer insulating film formed over the semiconductor substrate and made of insulating material having a moisture content of $5\times10^{-3}$ g/cm$^3$ or lower; and a hydrogen diffusion barrier film formed over the interlayer insulating film and made of material having a higher hydrogen diffusion barrier function than a hydrogen diffusion barrier function of material of the interlayer insulating film.

According to another aspect of the present invention, there is provided a manufacture method for a semiconductor device, comprising steps of: (a) forming an interlayer insulating film made of insulating material over a semiconductor substrate; (b) forming a hydrogen diffusion barrier film over the interlayer insulating film, the hydrogen diffusion barrier film being made of material having a higher hydrogen diffusion barrier function than a hydrogen diffusion barrier function of material of the interlayer insulating film; and (c) thermally treating the semiconductor substrate formed with the interlayer insulating film and the hydrogen diffusion barrier film, wherein the step (a) forms the interlayer insulating film under a condition that a moisture content becomes $5\times10^{-3}$ g/cm$^3$ or lower.

According to still another aspect of the present invention, there is provided a manufacture method for a semiconductor device, comprising steps of: (a) forming an interlayer insulating film made of insulating material over a semiconductor substrate; (b) forming a hydrogen diffusion barrier film over the interlayer insulating film, the hydrogen diffusion barrier film being made of material having a higher hydrogen diffusion barrier function than a hydrogen diffusion barrier function of material of the interlayer insulating film; and (c) thermally treating the semiconductor substrate formed with the interlayer insulating film and the hydrogen diffusion barrier film, wherein the step (a) forms the interlayer insulating film by plasma enhanced CVD using oxygen or ozone, and TEOS as source materials under a condition of a pressure of 930 Pa or higher.

According to still another aspect of the present invention, there is provided a manufacture method for a semiconductor device comprising steps of: (a) deciding an allowable upper limit value of a content of moisture contained in an insulating film of silicon oxide; (b) preparing a plurality of evaluation samples having insulating films of silicon oxide over substrates, the insulating films being formed by plasma enhanced CVD using oxygen or ozone, and TEOS as source materials under different pressure conditions; (c) measuring the content of moisture in the insulating film of each of the evaluation samples; (d) deciding a pressure condition setting the content of moisture in the insulating film to the allowable upper limit value or lower; and (e) forming an insulating film of silicon oxide over a semiconductor substrate by plasma enhanced CVD using oxygen or ozone, and TEOS as source materials under the pressure condition decided at the step (d).

According to still another aspect of the present invention, there is provided a manufacture method for a semiconductor device comprising steps of: (a) deciding an allowable upper limit value of a content of moisture contained in an insulating film of silicon oxide; (b) preparing a plurality of evaluation samples having insulating films of silicon oxide over substrates by plasma enhanced CVD using oxygen or ozone, and TEOS as source materials under conditions having different flow rate ratios of oxygen or ozone to a total flow rate of gas introduced into a chamber; (c) measuring the content of moisture in the insulating film of each of the evaluation samples; (d) deciding a flow rate ratio condition setting the content of moisture in the insulating film to the allowable upper limit value or lower; and (e) forming an insulating film of silicon oxide over a semiconductor substrate by plasma enhanced CVD using oxygen or ozone, and TEOS as source materials under the flow rate ratio condition decided at the step (d).

As the content of moisture in the interlayer insulating film is reduced, cracks are not likely to be generated even if heat treatment is performed after the hydrogen diffusion barrier film is formed on the interlayer insulating film. As a silicon oxide film is formed by plasma enhanced CVD using oxygen or ozone, and TEOS at a chamber pressure of 930 Pa or higher, the interlayer insulating film with low moisture content enough not to be cracked can be formed.

BRIEF DESCRIPTION OF THE DRAWINGS

FIG. 3 is a table showing film forming conditions, film thickness uniformities and growth rates of an insulating film forming method according to an embodiment and a comparative example.

DESCRIPTION OF THE PREFERRED EMBODIMENTS

With reference to FIGS. 1A to 1F, description will be made on a semiconductor device manufacture method according to an embodiment.

Figure 1A:
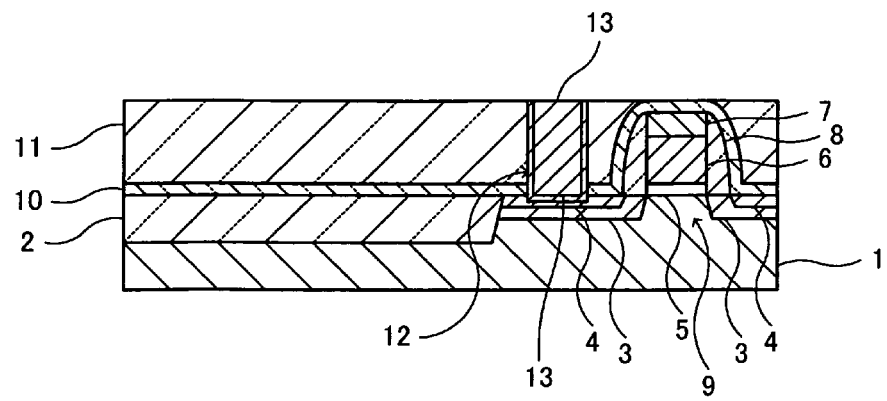
FIGS. 1A to 1F are cross sectional views of a semiconductor device during intermediate manufacture processes illustrating a method of manufacturing a semiconductor device according to an embodiment.

As shown in FIG. 1A, necessary wells are formed in a surface layer of a semiconductor substrate 1 made of silicon. An element isolation insulating film 2 is formed by shallow trench isolation (STI) or the like to define active regions. A MOS transistor 9 is formed in an active region. The MOS transistor 9 consists of a gate insulating film 5, a gate electrode 6, source and drain diffusion layers 3, and sidewall spacers 8. A cobalt silicide (CoSi$_2$) film 4 is formed on the surfaces of the source and drain diffusion layers 3. A cap film 7 of cobalt silicide is formed on the upper surface of the gate electrode 6. The MOS transistor 9 can be formed by well-known film forming, photolithography, ion implantation, silicidation techniques and the like.

A silicon oxynitride film 10 is formed on the substrate by CVD, covering the MOS transistor 9. An interlayer insulating film 11 of silicon oxide is formed by CVD on the silicon oxynitride film 10. The silicon oxynitride film 10 prevents moisture from penetrating the gate insulating film 5 and the like while the interlayer insulating film 11 is formed. The surface of the interlayer insulating film 11 is planarized by chemical mechanical polishing (CMP). During this polishing, the silicon oxynitride film 10 deposited above the gate electrode 6 functions as a stopper of the polishing.

A via hole 12 is formed through the interlayer insulating film 11 and silicon oxynitride film 10. The via hole 12 reaches the silicide film 4 on the source/drain diffusion layer 3 of the MOS transistor 9. The inner wall of the via hole 12 is covered with a barrier metal film of TiN or the like, and a plug 13 of tungsten (W) or the like fills the via hole 12. The barrier metal film and plug 11 can be formed by well-known TiN film formation, W film formation and CMP.

Figure 1B:
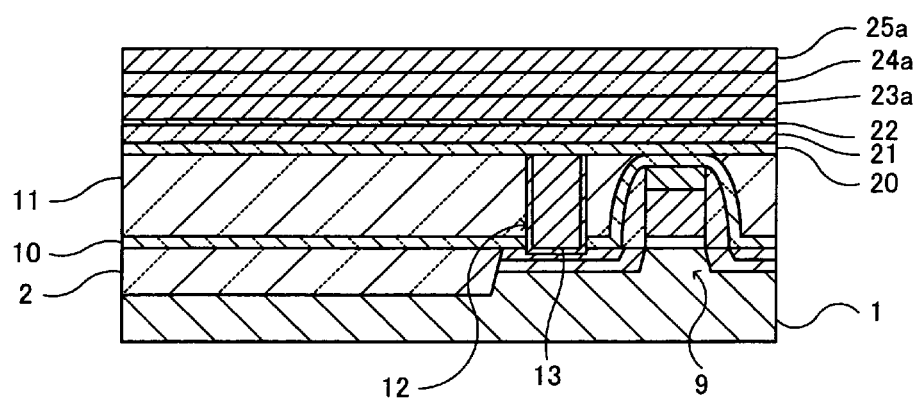

As shown in FIG. 1B, a silicon oxynitride film 20 having a thickness of 100 nm is formed on the interlayer insulating film 11 by CVD. A silicon oxide film 21 having a thickness of 130 nm is formed on the silicon oxynitride film 20 by CVD using O$_2$ and TEOS. An alumina (aluminum oxide) film 22 having a thickness of 20 nm is formed on the silicon oxide film 21. The alumina film 22 can be formed by sputtering, metal organic chemical vapor deposition (MOCVD) or the like. The alumina film 22 may be formed by hydrolysis represented by the following chemical formula:

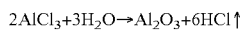

$$2AlCl_3 + 3H_2O \rightarrow Al_2O_3 + 6HCl\uparrow$$

A platinum (Pt) film 23a having a thickness of 150 nm is formed on the alumina film 22 by sputtering. A ferroelectric film 24a having a thickness of 150 nm and made of Pb(Zr, Ti)O$_3$ (PZT) is formed on the Pt film 23a. The ferroelectric film 24a can be formed by MOCVD, sputtering or the like. The ferroelectric film 24a may be made of other ferroelectric oxide such as (Pb, La)(Zr, Ti)O$_3$ (PLZT) and SrBi$_2$Ta$_2$O$_9$ (SBT), instead of PZT.

An iridium oxide film 25a having a thickness of 250 nm is formed on the ferroelectric film 24a. The iridium oxide film 25a can be formed by sputtering a metal Ir target by using plasma of mixture gas of oxygen and argon. For example, the iridium oxide film 25a is formed by depositing it to a thickness of 50 nm under the conditions of a pressure of 0.8 Pa, an oxygen flow rate of 100 sccm, an argon flow rate of 100 sccm, a substrate temperature of a room temperature and an RF power of 1 kW, and thereafter depositing it to a thickness of 200 nm by raising the RF power to 2 kW. The oxygen concentration in an upper layer region of the iridium oxide film 25a can therefore be set lower than that in the lower layer region.

Figure 1C:
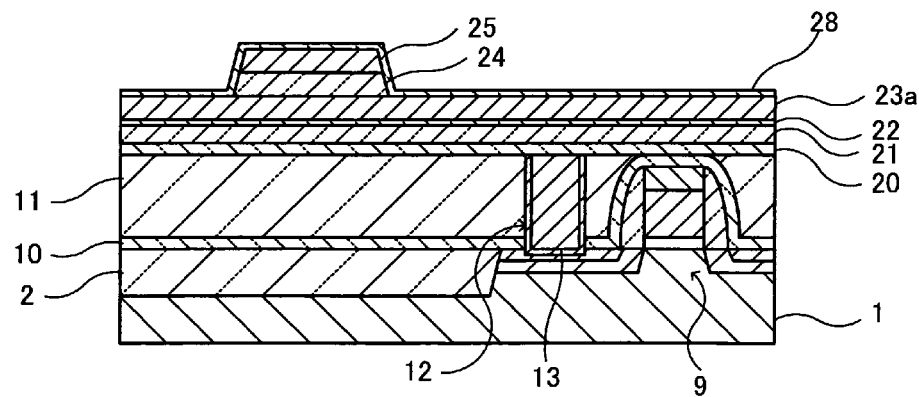

As shown in FIG. 1C, by covering a partial surface area of the iridium oxide film 25a with a resist pattern, the iridium oxide film 25a and ferroelectric film 24a are dry-etched to form an upper electrode 25 of iridium oxide and a capacitor ferroelectric film 24 of PZT. After the resist pattern is removed, an alumina film 28 having a thickness of 20 nm is formed covering the surface of the lamination structure of the capacitor ferroelectric film 24 and upper electrode 25 and the surface of the Pt film 23a.

Figure 1D:
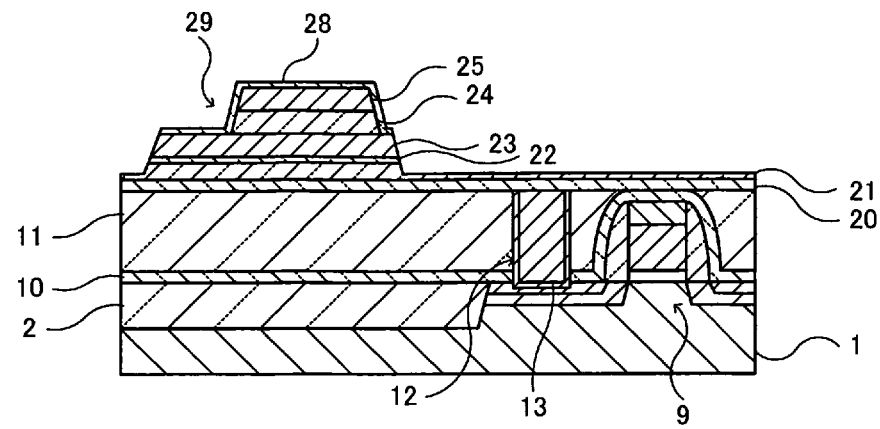

As shown in FIG. 1D, by covering a partial surface area of the alumina film 28 with a resist pattern, the alumina film 28, Pt film 23a and underlying alumina film 22 are dry-etched to form a lower electrode 23 of Pt. The lower electrode 23, capacitor ferroelectric film 24 and upper electrode 25 constitute a ferroelectric capacitor 29.

The alumina film 22 is left under the lower electrode 23. This dry etching also etches the silicon oxide film 21 disposed under the alumina film 22 in the upper layer region not covered with the resist pattern. For example, the silicon oxide film 21 not covered with the resist pattern is thinned to a thickness of 40 nm. The alumina film 28 is left on the upper surface of the lower electrode 23, the side faces of the capacitor ferroelectric film 24 and the upper surface of the upper electrode 25.

Figure 1E:
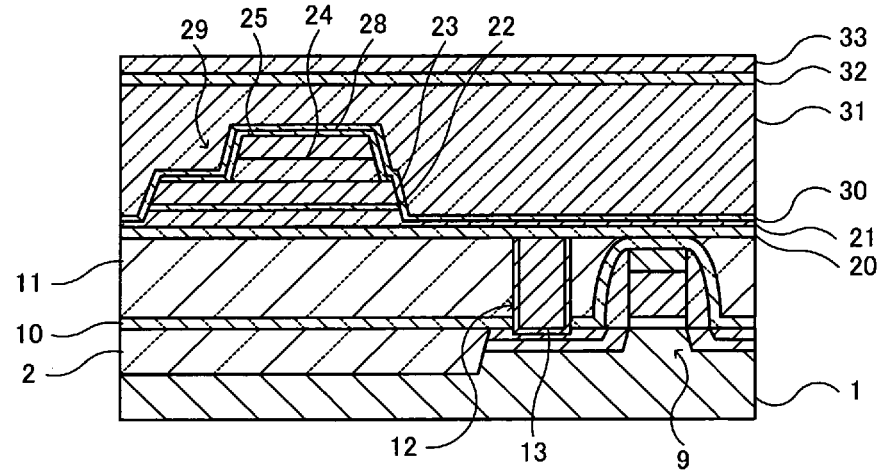

As shown in FIG. 1E, the whole exposed surface is covered with an alumina film 30 having a thickness of 20 nm. An interlayer insulating film 31 of silicon oxide is formed on the alumina film 30 by CVD using $O_2$ and TEOS. The conditions of forming the interlayer insulating film 31 will be later detailed. The surface of the interlayer insulating film 31 is planarized by CMP. With this planarizing process, the thickness of the interlayer insulating film 31 in the region where the ferroelectric capacitor 29 is not disposed, is set to, e.g., 980 nm.

Before or after planarizing the surface of the interlayer insulating film 31, the interlayer insulating film 31 is exposed to $N_2$ or $N_2O$ plasma. This plasma process reduces moisture in the interlayer insulating film and improves its film quality. It is preferable to set the substrate temperature to 200° C. to 450° C. during the plasma process.

A hydrogen diffusion barrier film 32 having a thickness of 20 nm and made of alumina is formed on the planarized interlayer insulating film 31. An underlying film 33 having a thickness of 300 nm and made of silicon oxide is formed on the hydrogen diffusion barrier film 32. The underlying film 33 is formed by the same method as that for the interlayer insulating film 31.

Figure 1F:
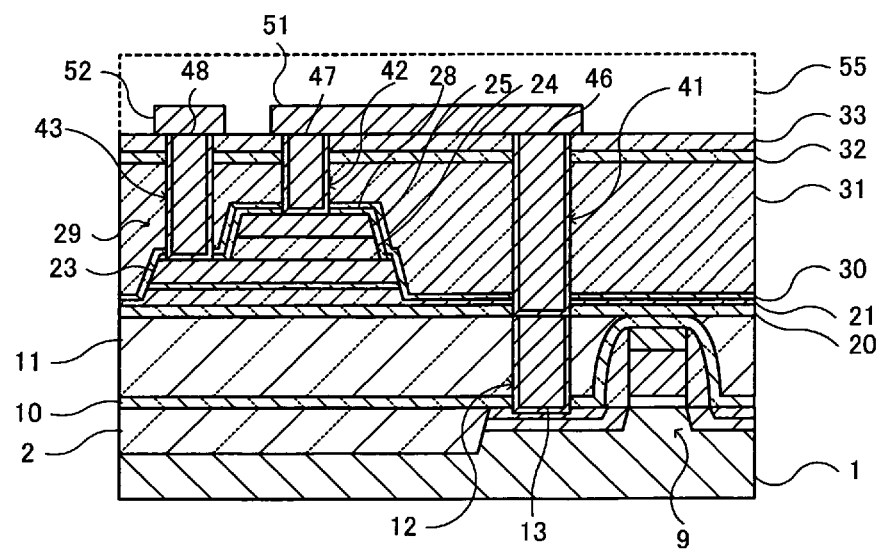

As shown in FIG. 1F, via holes 41, 42 and 43 are formed. The via hole 41 extends through the underlying film 33, hydrogen diffusion barrier film 32, interlayer insulating film 31, lower alumina film 30, silicon oxide film 21 and silicon oxynitride film 20 and reaches the upper surface of the plug 13. The via hole 42 reaches the upper surface of the upper electrode 25. The other via hole 43 passes by the upper electrode 25 and capacitor ferroelectric film 24 and reaches the upper surface of the lower electrode 23.

The inner faces of the via holes 41 to 43 are covered with a barrier metal film of TiN or the like, and plugs 46, 47 and 48 of W or the like fills the via holes 41 to 43.

Heat treatment is performed at a temperature of 400° C. to 600° C. in an oxygen atmosphere, a nitrogen atmosphere or an oxygen and nitrogen mixed atmosphere. This heat treatment can remedy deterioration of the characteristics of the ferroelectric capacitor 29 caused by the previous processes.

Wirings 51 and 52 of aluminum (Al), Al—Cu alloy or the like are formed on the underlying film 33. The wiring 51 connects the plugs 46 and 47 so that the MOS transistor 9 is connected to the upper electrode 25 of the ferroelectric capacitor 29. The other wiring 52 is connected via the plug 48 to the lower electrode 23 of the ferroelectric capacitor 29. The underlying film 33 prevents the wirings 51 and 52 from directly contacting the hydrogen diffusion barrier film 32.

The wirings and hydrogen diffusion barrier film 32 may be influenced each other depending upon a combination of a wiring material and a material of the hydrogen diffusion barrier film 32. In such a case, it is preferable to use the underlying film 33 made of insulating material different from that of the hydrogen diffusion barrier film 32.

A multi-layer wiring structure 55 having an interlayer insulating film and an upper wiring layer alternately and repetitively laminated is formed over the wirings 51 and 52.

Hydrogen is prevented from penetrating the capacitor ferroelectric film 24, by the alumina films 22, 28 and 30 covering the bottom, side faces and upper surface of the ferroelectric capacitor 29 and by the hydrogen diffusion barrier film 32 formed on the interlayer insulating film 31. Portions of the alumina films 28 and 30 are deposited on the side faces of the ferroelectric capacitor 29. The alumina films deposited on the side faces have a film quality inferior to that of the alumina film deposited on the planarized surface. These alumina films have in some cases an insufficient function of preventing penetration of hydrogen.

Since the hydrogen diffusion barrier film 32 is deposited on the planarized surface, it can easily maintain a high film quality over the whole region. It is therefore possible to obtain a sufficient hydrogen diffusion barrier function so that the deterioration of the characteristics of the ferroelectric capacitor 29 can be avoided. The hydrogen diffusion barrier film 32 may be made of material having a higher hydrogen diffusion barrier function than that of the material of the interlayer insulating film 31. Such material of the hydrogen diffusion barrier film may be aluminum oxide, aluminum nitride, tantalum oxide, tantalum nitride, titanium oxide, zirconium oxide or the like.

Figure 2:
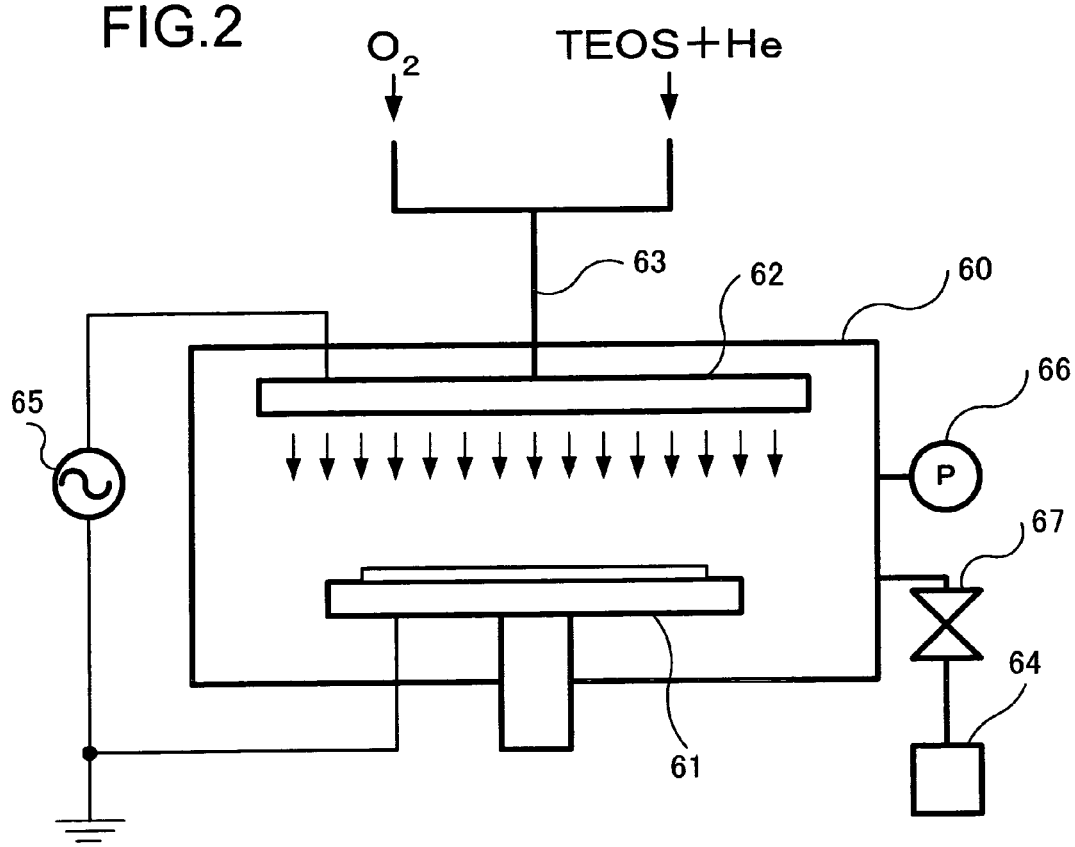
FIG. 2 is a schematic diagram of a CVD system used by the semiconductor device manufacture method of the embodiment.

FIG. 2 is a schematic diagram of a CVD film forming system for forming the interlayer insulating film 31. A stage 61 for holding a substrate is disposed in a chamber 60, and a flat shape opposing electrode 62 is disposed above the stage 61. A radio frequency power source 65 supplies a plasma generation high frequency power across the stage 61 and opposing electrode 62. A heater is disposed in the stage 61 so that the substrate held on the stage 61 can be heated to a predetermined temperature.

The opposing electrode 62 functions also as gas inlet ports. Gas flowing through a gas flow path 63 flows into the chamber 60 from holes formed in an opposing face of the opposing electrode 62. $O_2$ and TEOS are supplied into the chamber 60 via the gas flow path 63. He gas is used as carrier gas for TEOS. A supply amount of $O_2$ is controlled by a gas flow meter, and a supply amount of TEOS is controlled by a liquid flow meter.

A vacuum pump 64 exhausts air in the chamber 60 via a conductance valve 67. A pressure meter 66 measures a pressure in the chamber 60. By changing a fluid resistance with the conductance valve 67, the pressure in the chamber 60 can be controlled to have a desired value.

FIG. 3 is a table showing film forming conditions, film thickness uniformities and growth rates of three samples of the interlayer insulating film 31 shown in FIG. 1E formed under different film forming conditions. Each sample has a silicon oxide film corresponding to the interlayer insulating film 31, but does not have a film corresponding to the upper hydrogen diffusion barrier film 32. The film thickness uniformity is defined by (Tmax−Tmin)/(Tmax+Tmin) where Tmax is a thickness at the position where the interlayer insulating film 31 has the maximum thickness and Tmin is a thickness at the position where the interlayer insulating film 31 has the minimum thickness.

Figure 4:
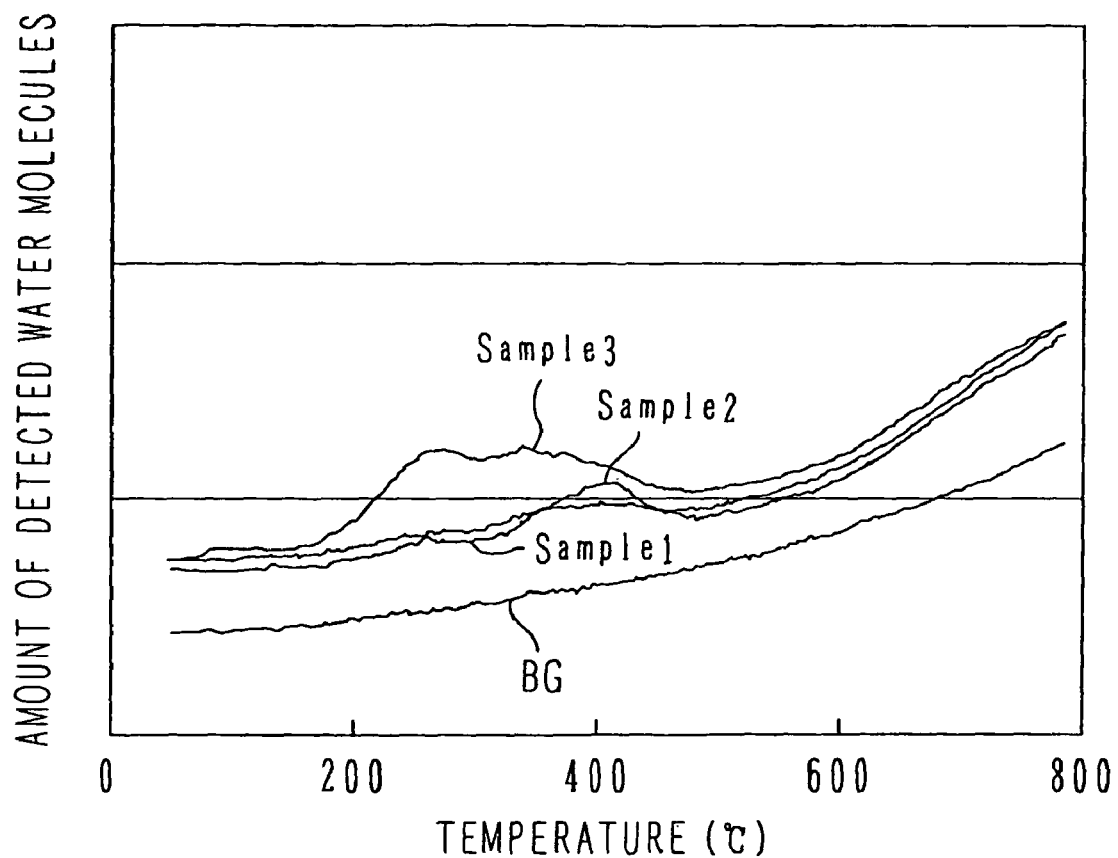
FIG. 4 is a graph showing the measurement results of a moisture content desorbed by a raised temperature desorption method from three samples shown in FIG. 3, the measurement being made with a quadrupole mass spectrometer.

FIG. 4 is a graph showing the measurement results of a content of moisture desorbed by a raised temperature desorption method from three samples #1, #2 and #3 shown in FIG. 3, the measurement being made with a quadrupole mass spectrometer. The abscissa represents a temperature in the unit of "° C." and the ordinate represents an intensity corresponding to a content of detected water molecules in a logarithmic scale. The lowest solid line BG indicates a background level. Comparing the film forming conditions of the samples #1, #2 and #3 with each other, only the pressure is different and other film forming conditions are the same. It can be seen from the graph that as the pressure is raised from 665 Pa to 1197 Pa, the amount of detected water molecules contained in the interlayer insulating film becomes low.

Figure 5:
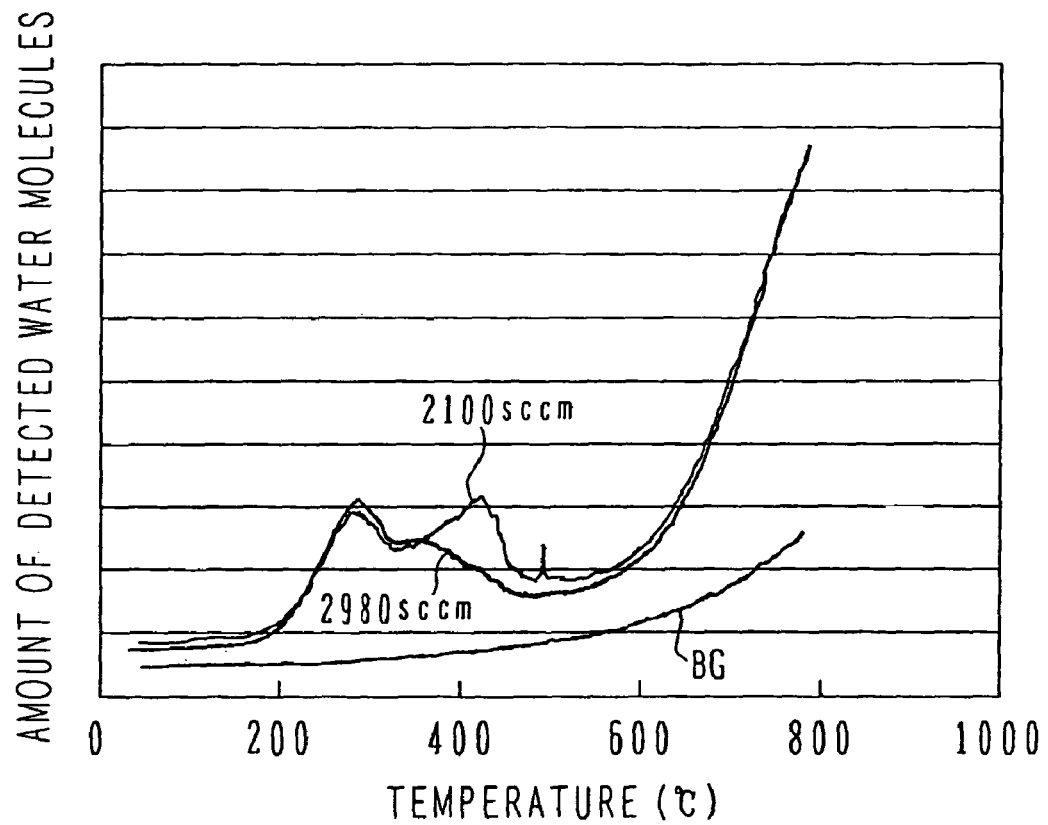
FIG. 5 is a graph showing the measurement results of a moisture content desorbed by a raised temperature desorption method from two samples formed at different oxygen flow rates, the measurement being made with a quadrupole mass spectrometer.
Figure 6A:
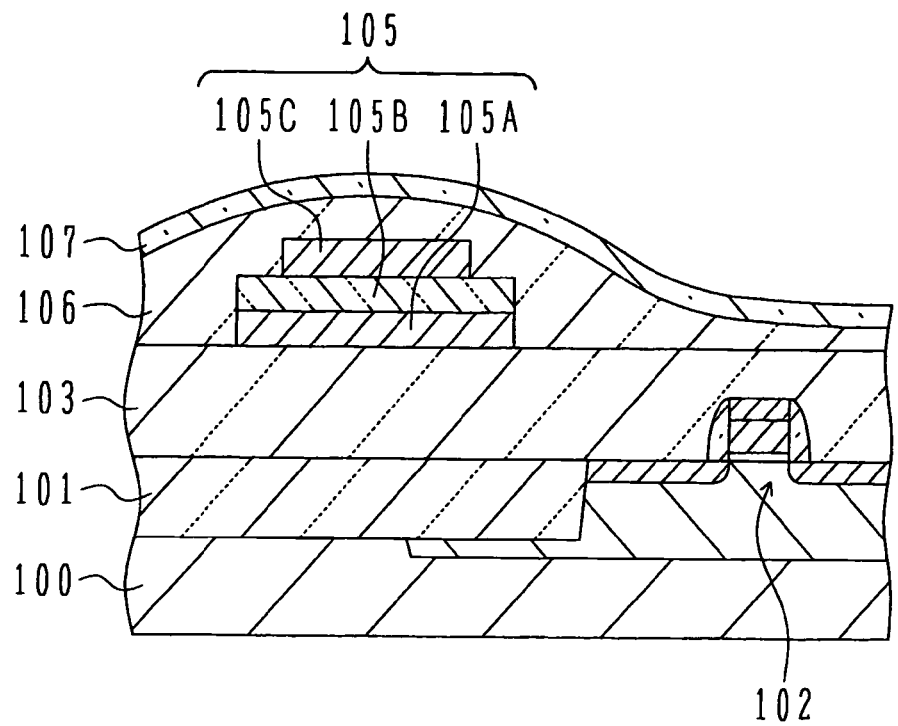
FIG. 6A is a cross sectional view of a semiconductor device manufactured by a conventional method.
Figure 6B:
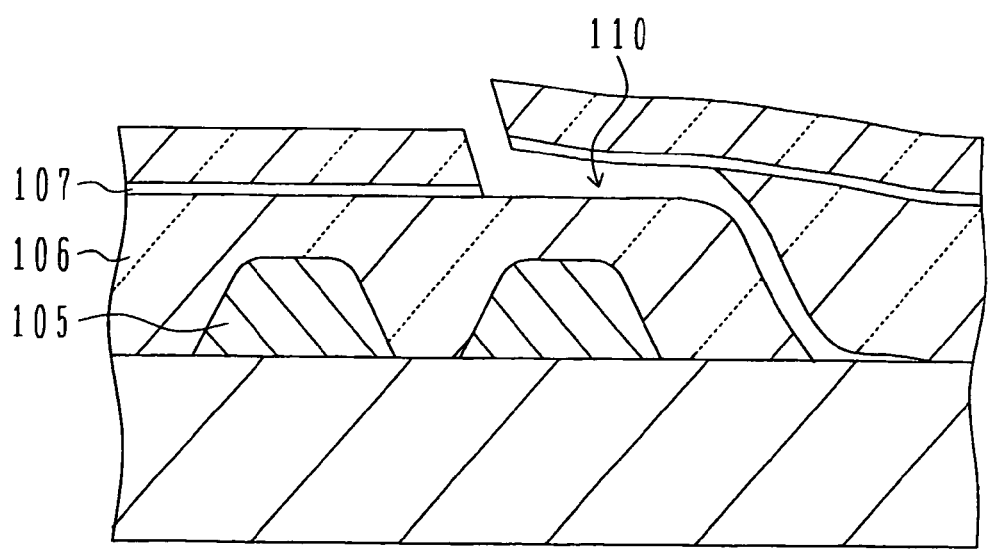
FIG. 6B is a diagram sketched from an electron microscopic photograph of a semiconductor device with a crack.

FIG. 5 is a graph showing the measurement results of a content of moisture desorbed by a raised temperature desorption method from two samples formed at different oxygen flow rates, the measurement being made with a quadrupole mass spectrometer. The abscissa represents a temperature in the unit of "° C." and the ordinate represents an intensity corresponding to a content of detected water molecules in a logarithmic scale. The lowest solid line BG indicates a background level. One sample was formed at an oxygen flow rate of 2100 sccm and the other sample was formed at an oxygen flow rate of 2980 sccm. The other film forming conditions are the same for both the samples, i.e., a pressure is 1197 Pa, a supplied power is 700 W, and a TEOS flow rate is 690 mg/min. It can be seen from the graph that as the oxygen flow rate increases, the amount of detected water molecules contained in the interlayer insulating film becomes low.

If the content of moisture contained in the interlayer insulating film 31 of the semiconductor device shown in FIG. 1E is low, generation of a crack to be caused by a volume expansion of the moisture can be suppressed during heat treatment to be performed after the interlayer insulating film 31 is covered with the hydrogen diffusion barrier film 32. In order to prevent generation of a crack, it is preferable to set the content of moisture in the interlayer insulating film 31 to $5 \times 10^{-3}$ g/cm$^3$ or lower. The content of moisture in the interlayer insulating film 31 can be set to the above-described allowable upper limit value or lower by adjusting the pressure and oxygen flow rate when the interlayer insulating film 31 is formed.

The content of moisture in the interlayer insulating film can be evaluated, for example, by analyzing gas desorbed by the raised temperature desorption method, with a mass spectrometer. More specifically, a silicon substrate formed with the interlayer insulating film is heated in a ultra high vacuum to raise its temperature and desorbed gas is analyzed with the mass spectrometer.

From the comparison between the samples #1, #2 and #3 in the table shown in FIG. 3, it can be understood that there is a tendency that as a pressure is raised, the film thickness uniformity is degraded and the growth rate is lowered. In the structure that the hydrogen diffusion barrier film 32 is not disposed, the interlayer insulating film 31 has been formed at a pressure of about 665 Pa, from the viewpoint of the film thickness uniformity and growth rate. However, if the hydrogen diffusion barrier film 32 is disposed and the interlayer insulating film 31 is formed under the condition of the pressure of 665 Pa, a crack was generated in the subsequent heat treatment. In order to prevent generation of a crack, it is preferable to set the pressure to 930 Pa or higher during forming the interlayer insulating film 31. If the pressure is set too high, plasma stability lowers. It is preferable to set the pressure in the chamber to a pressure equal to or lower than the pressure capable of sufficiently maintaining the plasma stability. For example, the pressure is preferably set to 1330 Pa or lower.

From the comparison between the two samples shown in FIG. 5, it can be understood that as the oxygen flow rate increases, the film thickness uniformity is degraded and the film growth rate is lowered. For the structure that the hydrogen diffusion barrier film 32 is not disposed, the oxygen flow rate is preferably set to about 2100 sccm from the viewpoint of the film thickness uniformity and growth rate. However, for the structure that the hydrogen diffusion barrier film 32 is disposed, the oxygen flow rate is preferably increased to about 2980 sccm from the viewpoint of preventing generation of a crack.

In the above-described embodiment, although $O_2$ and TEOS are used as the source material of the interlayer insulating film 31, $O_3$ may be used instead of $O_2$.

Also in the above-described embodiment, although the interlayer insulating film 31 is made of silicon oxide, other insulating materials may be used. Also in this case, the content of moisture is preferably set to the above-described allowable upper limit value or lower.

Next, description will be made on a method of forming an insulating film of silicon oxide having a moisture content equal to or lower than the allowable upper limit value. Decided first is an allowable upper limit value of the content of moisture contained in an insulating film of silicon oxide. Insulating films of silicon oxide are formed on wafers by plasma enhanced CVD using oxygen or ozone, and TEOS as source materials under different pressure conditions to prepare a plurality of evaluation samples.

Measured is the content of moisture in the insulating film of each of the plurality of evaluation samples. The pressure condition is decided which sets the content of moisture in the insulating film to the allowable upper limit value or lower. An insulating film of silicon oxide is formed on a substrate by plasma enhanced CVD using oxygen or ozone, and TEOS as source materials under the decided pressure condition. The conditions other than the pressure conditions are the same as those used when the evaluation samples were formed.

A plurality of evaluation samples having insulating films of silicon oxide may be prepared, the insulating films being formed by plasma enhanced CVD using oxygen or ozone, and TEOS as source materials under conditions having different flow rate ratios of oxygen or ozone to the total flow rate of gas introduced into the chamber. In this case, it is possible to decide the flow rate ratio condition which sets the content of moisture in the insulating film to the allowable upper limit value or lower. As the insulating film is formed under the decided flow rate ratio condition, the content of moisture can be set to the allowable upper limit value or lower. In this case, the conditions other than the flow rate ratio condition are the same as those used when the evaluation samples were formed.

The present invention has been described in connection with the preferred embodiments. The invention is not limited only to the above embodiments. It will be apparent to those skilled in the art that other various modifications, improvements, combinations, and the like can be made.

I claim:

1. A semiconductor device comprising:
   a semiconductor substrate having semiconductor elements formed thereon;
   an interlayer insulating film formed over the semiconductor substrate and made of insulating material having a moisture content of $5 \times 10^{-3}$ g/cm$^3$ or lower;
   a first hydrogen diffusion barrier film formed over the interlayer insulating film and made of material having a higher hydrogen diffusion barrier function than a hydrogen diffusion barrier function of material of the interlayer insulating film;
   a second hydrogen diffusion barrier film disposed between the semiconductor substrate and the interlayer insulating film, and made of material having a higher hydrogen diffusion barrier function than a hydrogen diffusion barrier function of material of the interlayer insulating film;
   a via hole penetrating the first hydrogen diffusion barrier film, the interlayer insulating film and the second hydrogen barrier film; and
   a plug filling the via hole, further comprising
   a ferroelectric capacitor formed over the semiconductor substrate and covered with the interlayer insulating film, wherein the second hydrogen diffusion barrier film covers an upper face and a side face of the ferroelectric capacitor.

2. The semiconductor device according to claim 1, wherein the interlayer insulating film is made of silicon oxide.

3. The semiconductor device according to claim 1, wherein the first hydrogen diffusion barrier film is made of aluminum oxide, aluminum nitride, tantalum oxide, tantalum nitride, titanium oxide, or zirconium oxide.

4. The semiconductor device according to claim 1, wherein the plug is electrically connected to one of the semiconductor elements and the ferroelectric capacitor.

5. The semiconductor device according to claim 1, further comprises a third hydrogen diffusion barrier film covering a bottom face of the ferroelectric capacitor, and made of material having a higher hydrogen diffusion barrier function than a hydrogen diffusion barrier function of material of the interlayer insulating film.

6. The semiconductor device according to claim 1, wherein the second hydrogen diffusion barrier film is made of alumina.

7. The semiconductor device according to claim 5, wherein the third hydrogen diffusion barrier film is made of alumina.

* * * * *